United States Patent
Ismail et al.

(10) Patent No.: US 10,895,903 B2
(45) Date of Patent: Jan. 19, 2021

(54) PACKAGE POWER ZONE FOR LIMITING POWER CONSUMPTION EVEN WHEN INDIVIDUAL CONSUMERS DO NOT EXCEED INDIVIDUAL LIMITS

(71) Applicant: Apple Inc., Cupertino, CA (US)

(72) Inventors: James S. Ismail, Sunnyvale, CA (US); John M. Ananny, San Mateo, CA (US); John G. Dorsey, San Francisco, CA (US); Bryan R. Hinch, Campbell, CA (US); Aditya Venkataraman, Sunnyvale, CA (US); Keith Cox, Sunnyvale, CA (US); Inder M. Sodhi, Palo Alto, CA (US); Achmed R. Zahir, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 73 days.

(21) Appl. No.: 16/266,248

(22) Filed: Feb. 4, 2019

(65) Prior Publication Data
US 2019/0369693 A1    Dec. 5, 2019

Related U.S. Application Data

(60) Provisional application No. 62/679,811, filed on Jun. 2, 2018.

(51) Int. Cl.
| | | |
|---|---|---|
| G06F 1/26 | (2006.01) | |
| G06F 1/32 | (2019.01) | |
| G06F 1/324 | (2019.01) | |
| G06F 1/3287 | (2019.01) | |
| G06F 1/3234 | (2019.01) | |
| G06F 1/20 | (2006.01) | |
| G06F 1/3206 | (2019.01) | |
| G01R 21/133 | (2006.01) | |

(52) U.S. Cl.
CPC .............. G06F 1/324 (2013.01); G06F 1/206 (2013.01); G06F 1/3206 (2013.01); G06F 1/3243 (2013.01); G06F 1/3287 (2013.01); *G01R 21/1331* (2013.01)

(58) Field of Classification Search
CPC ...... G06F 1/206; G06F 1/3206; G06F 1/3234; G06F 1/3237; G06F 1/324; G06F 1/3243; G06F 1/3287
See application file for complete search history.

(56) References Cited

U.S. PATENT DOCUMENTS

| | | |
|---|---|---|
| 9,606,609 B2 | 3/2017 | Viswanadham |
| 2005/0044429 A1 | 2/2005 | Gaskins et al. |
| 2011/0093733 A1* | 4/2011 | Kruglick ............... G06F 1/3243 713/340 |

(Continued)

*Primary Examiner* — Nitin C Patel
(74) *Attorney, Agent, or Firm* — Kowert, Hood, Munyon, Rankin & Goetzel, P.C.; Lawrence J. Merkel

(57) ABSTRACT

In an embodiment, an electronic device includes a package power zone controller. The device monitors the overall power consumption of multiple components of a "package." The package power zone controller may detect workloads in which the package components (e.g. different types of processors, peripheral hardware, etc.) are each consuming relatively low levels of power, but the overall power consumption is greater than a desired target. The package power zone controller may implement various mechanisms to reduce power consumption in such cases.

19 Claims, 5 Drawing Sheets

(56) References Cited

U.S. PATENT DOCUMENTS

2012/0216058 A1* 8/2012 Wells .................... G06F 1/3206
　　　　　　　　　　　　　　　　　　　　713/322
2013/0155081 A1　　6/2013 Khodorkovsky et al.
2015/0370303 A1* 12/2015 Krishnaswamy ....... G06F 1/324
　　　　　　　　　　　　　　　　　　　　713/322

* cited by examiner

PACKAGE POWER ZONE FOR LIMITING POWER CONSUMPTION EVEN WHEN INDIVIDUAL CONSUMERS DO NOT EXCEED INDIVIDUAL LIMITS

This application claims benefit of priority to U.S. Provisional Patent Application Ser. No. 62/679,811, filed on Jun. 2, 2018. The above application is incorporated herein by reference in its entirety. To the extent that anything in above application conflicts with material expressly set forth in this application, the material expressly set forth herein controls.

BACKGROUND

Technical Field

Embodiments described herein are related to power management in electronic devices and, more particularly, to managing power at an integrated circuit package level.

Description of the Related Art

Controlling power consumption in an electronic device is critical to the device's usefulness. The consumption of power creates thermal energy, which causes the device to heat. If the device is hand-held, such as a portable device like a smart phone, personal digital assistant, etc., the temperature of the device can be uncomfortable for the user or even painful in the extreme. Furthermore, when the device becomes warm, it may be cause concern in the user or may affect the user's perception of the quality of the device. Heat can also damage the components of the electronic device.

For portable devices which operate on a finite power supply such as a battery (as opposed to effectively infinite supplies such as a wall plug), the power consumed reduces the energy in the finite power supply. Accordingly, controlling the consumption of power even in the absence of excessive thermal energy can increase the time before a charge is needed.

Electronic devices typically include various processors. For example, a device can include one or more central processing unit (CPU) processors as well as one or more special purpose processors such as graphics processing unit (GPU) processors. The processors often include features to control their power consumption. Thus, a workload that causes significant CPU execution can be controlled to provide as much performance as possible (and/or needed) while reducing the rate at which thermal energy causes the device to heat. As temperature begins to increase, mitigating steps can be taken to reduce CPU consumption while still supporting execution of the workload. For example, the CPU can be intermittently throttled (temporarily reducing clock frequency or temporarily disabling certain high-power-consuming CPU execution resources). The CPU can also be moved to a lower performance state (e.g. supply voltage magnitude and clock frequency) that supports sufficient performance for the workload to reduce power consumption. In other cases, the CPU can be reduced to a lower performance state temporarily to relieve thermal energy release, even if the lower performance state cannot support the workload completely. Similarly, GPU processors can support power control mechanisms. While these discrete mechanisms can control power consumption for workloads that are biased toward a specific processor, other workloads that are more balanced are difficult to control.

SUMMARY

In an embodiment, an electronic device includes a package power zone controller. The device monitors the overall power consumption of multiple components of a "package." The package power zone controller may detect workloads in which the package components (e.g. different types of processors, peripheral hardware, etc.) are each consuming relatively low levels of power, but the overall power consumption is greater than a desired target. The package power zone controller may implement various mechanisms to reduce power consumption in such cases.

BRIEF DESCRIPTION OF THE DRAWINGS

The following detailed description makes reference to the accompanying drawings, which are now briefly described.

Figure 1:
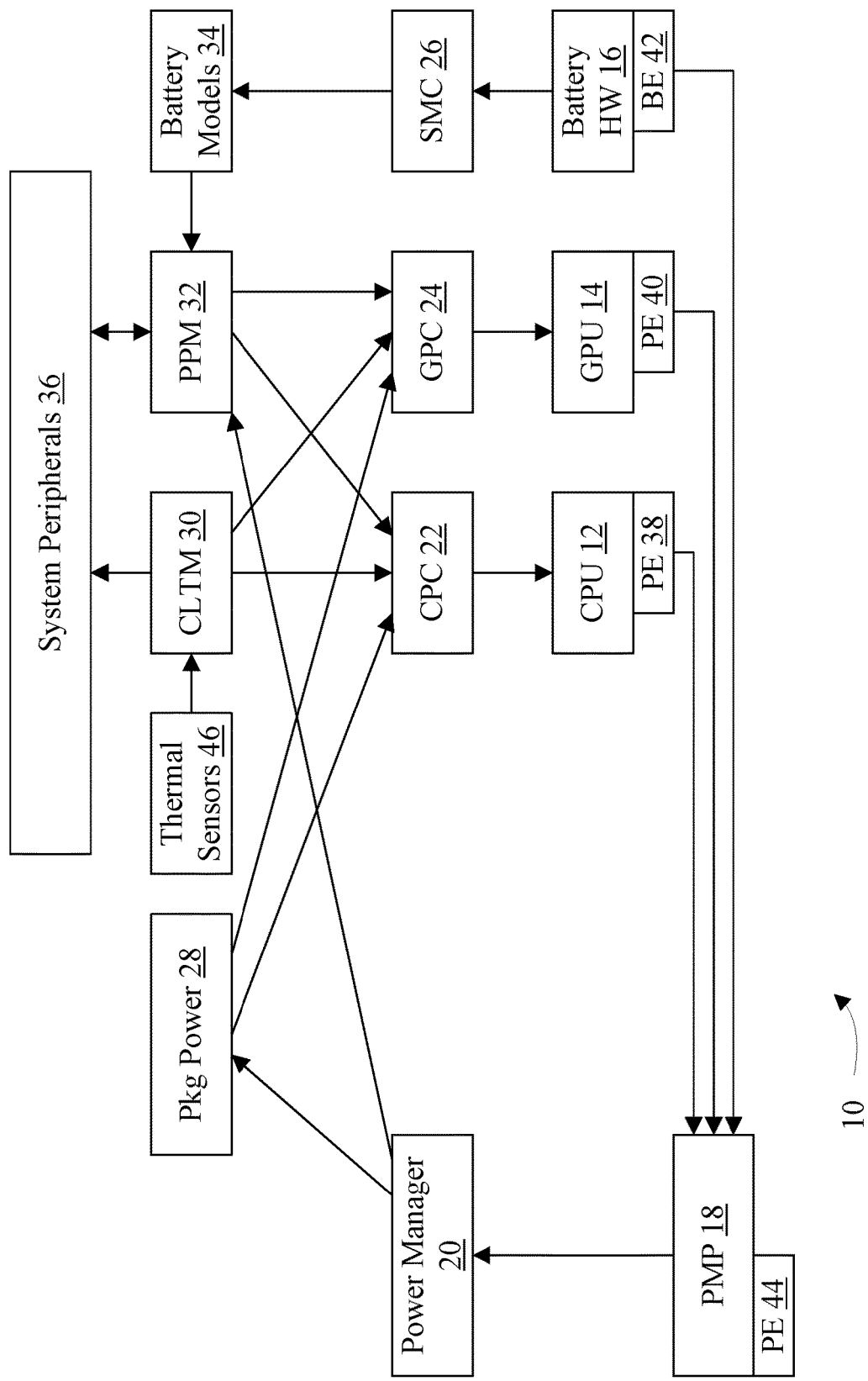
FIG. 1 is a block diagram of one embodiment of an electronic system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to. As used herein, the terms "first," "second," etc. are used as labels for nouns that they precede, and do not imply any type of ordering (e.g., spatial, temporal, logical, etc.) unless specifically stated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

DETAILED DESCRIPTION OF EMBODIMENTS

Various embodiments of a package power zone controller (or more briefly "package power controller") may detect the overall power consumption across multiple components of a package. The package may include at least one integrated circuit (IC), and may, in some embodiments, include multiple ICs physically coupled together as a unit. For example, multiple ICs in a chip-on-chip (CoC), wafer-on-wafer (WoW), package-on-package (PoP), or multichip module (MCM) configuration may be a package, or combinations of the above techniques may be used to form a package. The components of the package may be any portion of the IC or ICs over which power consumption may be monitored and controlled. For example, various processors may be components, in an embodiment. Processors may include CPUs, GPUs, and other special purpose processors such as digital signal processors (DSPs), image signal processors (ISPs), numerical co-processors, etc. In an embodiment, peripheral hardware in the IC may be a component, such as a memory subsystem or an input/output (I/O) subsystem. Specific I/O or other peripheral devices may be components, in an embodiment. Examples of specific peripheral devices may include: a display controller/display; video/image capture devices such as cameras and related processing hardware such as image signal processors (ISPs), video encoders/decoders, etc.; storage controllers and related storage (e.g. Flash memory and other forms of non-volatile solid-state storage devices, optical storage such as DVDs or CDs, magnetic storage such as hard disk drives, etc.); network interface controllers; audio controllers; etc.

The power consumption of the package, filtered over a desired time constant, may be managed to a target power consumption. The target may be developed based on the workload being performed in the device (e.g. its performance requirements) as well as the thermal energy generated by the package. If the package power consumption exceeds the target, the package may be said to have entered a package power zone. Entering a package power zone may be trigger one or more power reduction mechanisms in the device.

In an embodiment, component power controllers may be employed for specific components of the package as well. For example, various processor power controllers may monitor processor power, managing power consumption to a power target and detecting a processor power zone if the processor power consumption exceeds the target. The component power controllers may monitor component power consumption, filtered over desired time constants. The time constant for a given component may be the same as or different from the time constant used by the package power controller and time constants used by other components. If the component power consumption exceeds a target for the component, the component has entered a component power zone. Mitigating steps may be taken with respect to that component in response to entering the component power zone. The mitigating steps may vary from component to component based on the mechanisms supported by a given component. In an embodiment, there may be multiple time constants for a given component and there may be different consumption levels, targets, and mitigation mechanisms. For example, processors may have peak power controllers (short time constant) and thermal energy controllers (long time constants). Similarly, in an embodiment, there may be package peak power controllers (short time constants) and thermal energy controllers (long time constants).

In one embodiment, a package power controller may have a time constant that is between the short time constant of the peak power controller and the long time constant of the thermal energy controller. For example, the peak power controller may have a time constant that is on the order of milliseconds, the package power controller may be on the order of seconds, and the thermal manager may be on the order of tens of seconds or even minutes. There may also be an "instantaneous" time constant for functionality preservation. For example, a power supply droop detector may detect that the power supply voltage is drooping toward a level that may cause incorrect operation in the IC. In such cases, a very rapid ("instantaneous") mitigation may be needed to prevent the failure of the IC (e.g. stopping clocks or quickly reducing their frequency to reduce the load on the power supply, allowing it to recover from the droop).

The component power controllers and the package power controller may cooperate to manage power in the system. For example, each power controller may determine a mitigation to be applied to a component, and the most restrictive mitigation level may be selected. In another embodiment, the peak power controller and the thermal manager may be reconfigured to operate at the package level, and may communicate desired mitigation to the package power controller. The package power controller may determine how to divide the mitigation among the components. This embodiment allows the reconfigured peak power controller and thermal manager to be "unaware" of the underlying components in the package, which may change over various models/releases of the electronic device product. Thus, the reconfigured peak power controller and thermal manager may not be concerned with details of how components estimate energy use, what mechanisms the components implement for power consumption mitigation, if any, etc. Combinations of the above cooperative mechanisms may be used in other embodiments. Viewed in another way, each of the controllers may set a power consumption target or budget, and the minimum of the budgets may be selected. The mitigation techniques are invoked to reduce consumption if the budget is not exceeded, and de-invoked if the consumption is below the budget.

In an embodiment, the package may have observable power consumption. The observable power consumption may be the power consumption of the package components as a whole which may be determined directly or indirectly through sensors and/or power estimators, as described herein. In some embodiments, the total package power consumption may be observable. However, in other embodiments, some power consumption may not be observable and thus the total actual power consumption may be greater than the observable power consumption. Controllable power consumption may refer to power consumed by those components which have mitigation mechanisms that may be used by the power controllers to reduce the total power consumption. That is, not all components may have such mechanisms, in some embodiments.

Figure 3:
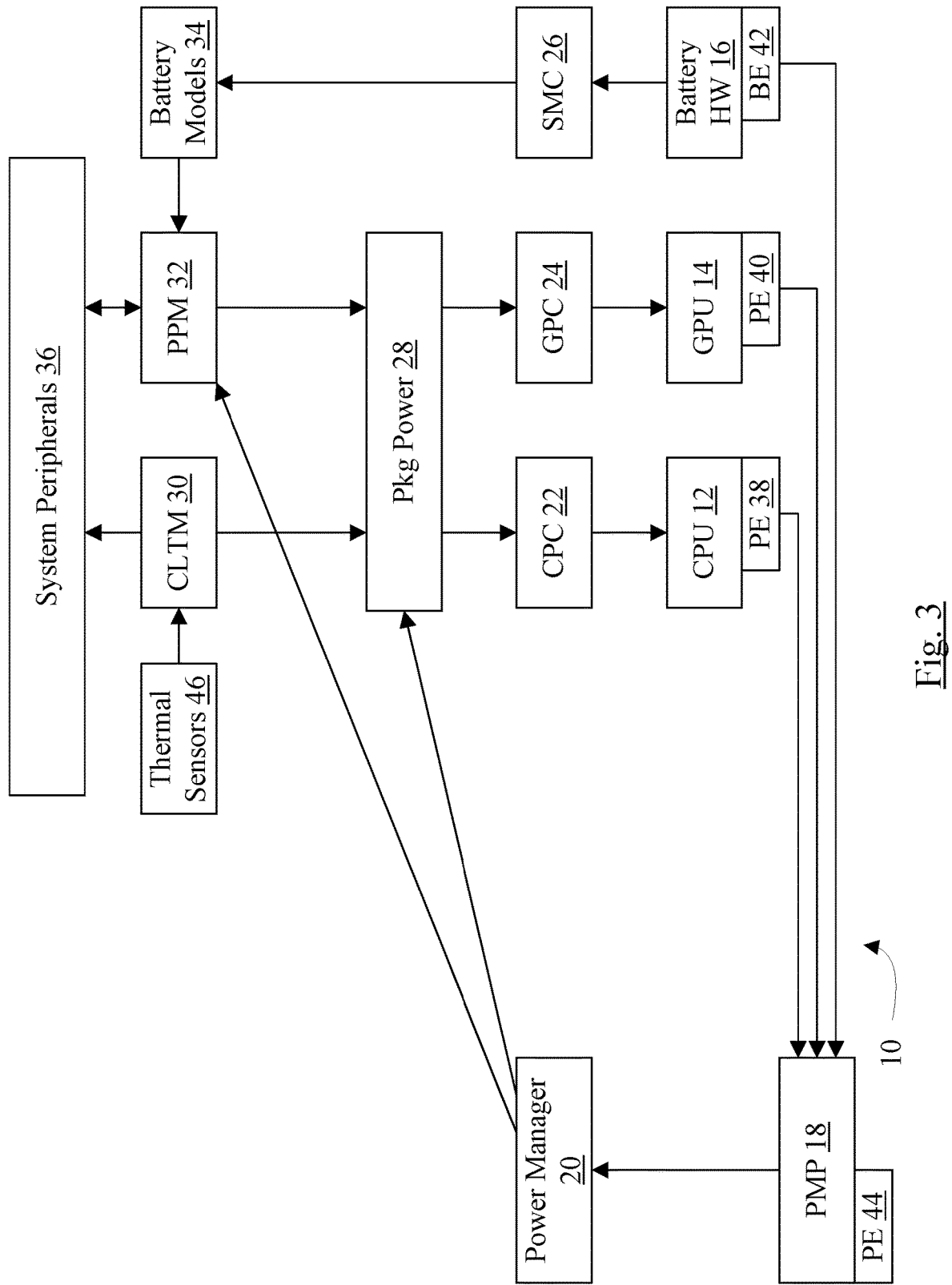
FIG. 3 is a block diagram of another embodiment of an electronic system.

FIGS. 1 and 3 are example systems that may employ the package power zone controller. Other embodiments are also possible. FIG. 1 illustrates a first embodiment of a system 10. In the embodiment of FIG. 1, the system 10 includes one or more CPU processors 12, one or more GPU processors 14, battery hardware 16, one more power management processors (PMPs) 18, a power manager 20, a CPU power controller (CPC) 22, a GPU power controller (GPC) 24, a system management controller (SMC) 26, a package power zone controller 28, a closed loop thermal manager (CLTM) 30, a peak power manager (PPM) 32, battery models 34, system peripherals 36, and thermal sensors 46. The processors may include power estimators (e.g. power estimator 44 for the PMP 18, power estimator 38 for the CPU 12 and power estimator 40 for the GPU 14 in FIG. 1). The battery hardware 16 may include a battery estimator 42. The power estimators 38, 40, and 44 and the battery estimator 42 are coupled to the PMP 18.

In an embodiment, the hardware components in FIG. 1 may be integrated onto an IC as a system on a chip (SOC). That is, the CPU 12, the GPU 14, the battery hardware 16, the PMP 18, the PEs 38, 40, and 44, the BE 42, the thermal sensors 46, and the system peripherals 36 may be integrated onto an SOC. In other embodiments, the hardware components may be integrated into multiple ICs.

The system peripherals 36 may include a memory controller that couples to memory (e.g. dynamic random access memory (DRAM) such as double data rate (DDR) SDRAM (e.g. DDR1, DDR2, DDR3, DDR4, DDS, etc. and/or mobile versions of the DDR DRAMs), RDRAM, etc.). Particularly, one or more DRAM chips may be mounted with the SOC as a package within the meaning of the package power control described herein.

The power manager 20 may monitor the power in the system 10, and may provide data to the package power controller 28 and the peak power manager 32 indicating if power zones have been entered. Alternatively, the power manager may provide power consumption values (filtered as appropriate) to the peak power manager 32 and the package power controller 28, which may compare the values to thresholds to determine if power zones have been entered and which may accumulate values over larger time periods, as desired. In an embodiment, the power manager 20 may be software executed on the PMP 18. In another embodiment, the power manager 20 may be hardware in the SOC. In still another embodiment, a combination of software and hardware may be used.

The power estimators 38, 40, and 44 may provide estimates of power consumed in the respective processors. For example, the power estimators may be digital power estimators that monitor the activity in the processors produce an estimate of the power consumed each clock cycle. The power estimators may further produce a running sum of the estimates. The sum may be periodically sampled by the PMP 18. Any power estimation hardware may be used, in various embodiments.

The CLTM 30 may receive data from various thermal sensors 46 in the system 10 and may manage power consumption in response to temperature increases. Temperature increase may be a slow-developing signal, and thus the time constant associated with CLTM 30 may be a long time constant (e.g. on the order of multiple seconds or minutes). In various embodiments, the CLTM 30 may be software executed on the CPUs 12, hardware, or a combination thereof.

The PPM 32 may manage peak power, and may attempt to mitigate rapidly occurring events such as power supply droop that can occur due to transient current spikes and the like. The PPM 32 may therefore be associated with a fast time constant (e.g. immediate for the power supply droop, or the order of milliseconds for other mitigation). Because the time constant is short for the PPM 32, the threshold level of power that indicates power zone entry for the PPM 32 may be higher than for slower time constant managers, which may need more time to react and therefore may warn earlier. In various embodiments, the PPM 32 may be software executed on the CPUs 12, hardware, or a combination thereof. The package power controller 28 may be a slower time constant power manager, in some embodiments, as compared to the PPM 32. In an embodiment, the PPM 32 may be configured to override other targets with an immediate (or instantaneous) target employed by the PPM 32 in the event that the PPM 32 detects an event which might cause functional failure and thus an instantaneous mitigation response is needed (e.g. the supply voltage droop described above).

The CPC 22 may control the power states of the CPU 12, and may include other CPU-specific power management features as well. Each power state may include a combination of clock frequency and supply voltage magnitude settings. Higher clock frequencies and supply voltage magnitudes may generally correspond to higher power consumption, and lower clock frequencies and supply voltage magnitudes may generally correspond to lower power consumption. Thus, for example, if a package power zone has been entered, reducing the power state of the CPU 12 may be a mitigation mechanism to control the power consumption. Similarly, if power consumption is below a power target, the power state of the CPU 12 may be increased. The power state may include various other controls as well. For example, in an embodiment having multiple CPU processors, a power state may include a limit to the number of cores that may be concurrently active. In another embodiment, portions of a CPU processor may be separately enabled (e.g. high-power consuming execution pipelines or execution units) and power states may include information on whether or not such portions are enabled and how many portions may be concurrently enabled. In an embodiment, the CPU 12 may also support throttling mechanisms (e.g. clock throttling, in which one or more pulses of the clock to the processor may be removed in a periodic fashion to rapidly reduce power consumption). Still other embodiments may support issue throttling, in which instruction issue rates are reduced (on all instructions or certain instruction types) to limit power consumption. The core limits, pipeline/execution unit enables, and various throttling mechanisms may be additional mitigation mechanisms in an embodiment.

Similarly, the GPC 24 may control the power state of the GPU 14, and may increase and decrease the power state in response to package power zone entry and/or to meet a power consumption target. Thus, GPU power state may be a mitigation mechanism. Various embodiments may support throttling mechanisms as well, or may support core limits and/or pipeline/execution unit enables as mitigation mechanisms.

Generally, a power mitigation mechanism (or more briefly "mitigation mechanism") may refer to any mechanism that can be applied to a component to reduce its power consumption without completely shutting down the component. A given component may support one or more mitigation mechanisms. Some components may not support mitigation mechanisms, and may thus not be part of the controllable package power.

While processor mitigation mechanisms have been used as examples above, other embodiments may support mitigation mechanisms for other types of components. For example, clock throttling or different power states may be supported by one or more of the system peripherals 36. Any set of components may be part of the controllable power consumption and may support any mitigation mechanisms.

The CPC 22 and the GPC 24 may operate independently. Accordingly, the determination of how to split the available power may be made prior to providing inputs to the CPC 22 and the GPC 24. For example, the package power controller 28, the CLTM 30, and the PPM 32 may determine how the power should be divided between the CPU 12 and the GPU 14. Alternatively, independent splitters may be used on the controls from the package power controller 28, the CLTM 30, and the PPM 32 to the CPC 22 and the GPC 24.

The battery hardware 16 may include the battery (or other energy storage device) as well as battery monitor hardware that may monitor the state of charge of the battery and other factors such as the load current, etc. The SMC 26 may interface with the battery hardware, and track long-term battery health statistics using the battery models 34. The battery models 34 may be an input to the PPM 32, which may control peak power based on the amount of charge remaining and other battery health factors, in addition to controlling peak power based on inputs from the power manager 20.

The BE 42 may be circuitry that provides estimates of battery state/battery health to the PMP 18, similar to the PEs 38, 40, and 44. For example, the BE 42 may be a digital estimator that estimates energy consumed from and/or added to the battery (in the case that the battery is being charged from a power source) on a clock cycle by clock cycle basis and provides the data to the PMP 18.

As mentioned previously, the CPU 12 may include one or more processors that serve at the central processing unit of the system 10. The processors may be designed to execute the instructions specified in an instruction set architecture. There are numerous instruction set architectures that may be employed, such as the ARM instruction set, the IA-32 or IA-64 instruction sets from Intel, the Power architecture from IBM, etc. The processors may employ any type of microarchitecture (e.g. in order, out of order, speculative, non-speculative, etc.) and may include any desired performance-enhancing features such as caches, register renaming, branch prediction, etc. Similarly, the GPU 14 may be one or more processors that serve as graphics processors in the system 10. The graphics processors may be designed to execute the instructions specified in a graphics instruction set architecture, and may include any desired performance-enhancing features as mentioned above. While CPU 12 and GPU 14 are illustrated in the present embodiment, other embodiments may employ any other desired processors (e.g. digital signal processors, image signal processors, numeric acceleration coprocessors, microcontrollers, etc.). Generally, processors may be of a processor type. The processor type may be based on the instruction set implemented by the processors. The types may include general purpose processors (e.g. CPUs, microcontrollers, etc.) or special purpose processors. The special purpose processors may also be separate types (e.g. GPU, digital signal processors, image signal processors, numeric acceleration processors, etc.).

The system peripherals 36 may include any desired circuitry, depending on the type of system 10. For example, in one embodiment, the system 10 may be a computing device (e.g., personal computer, laptop computer, etc.), a mobile device (e.g., personal digital assistant (PDA), smart phone, tablet, etc.), etc. In various embodiments of the system 10, the system peripherals 36 may include devices for various types of wireless communication, such as wifi, Bluetooth, cellular, global positioning system, etc. The peripherals 36 may also include additional storage, including RAM storage, solid state storage, or disk storage. The peripherals 36 may include user interface devices such as a display screen, including touch display screens or multitouch display screens, keyboard or other input devices, microphones, speakers, etc. In other embodiments, the system 10 may be any type of computing system (e.g. desktop personal computer, laptop, workstation, net top etc.).

Figure 2:
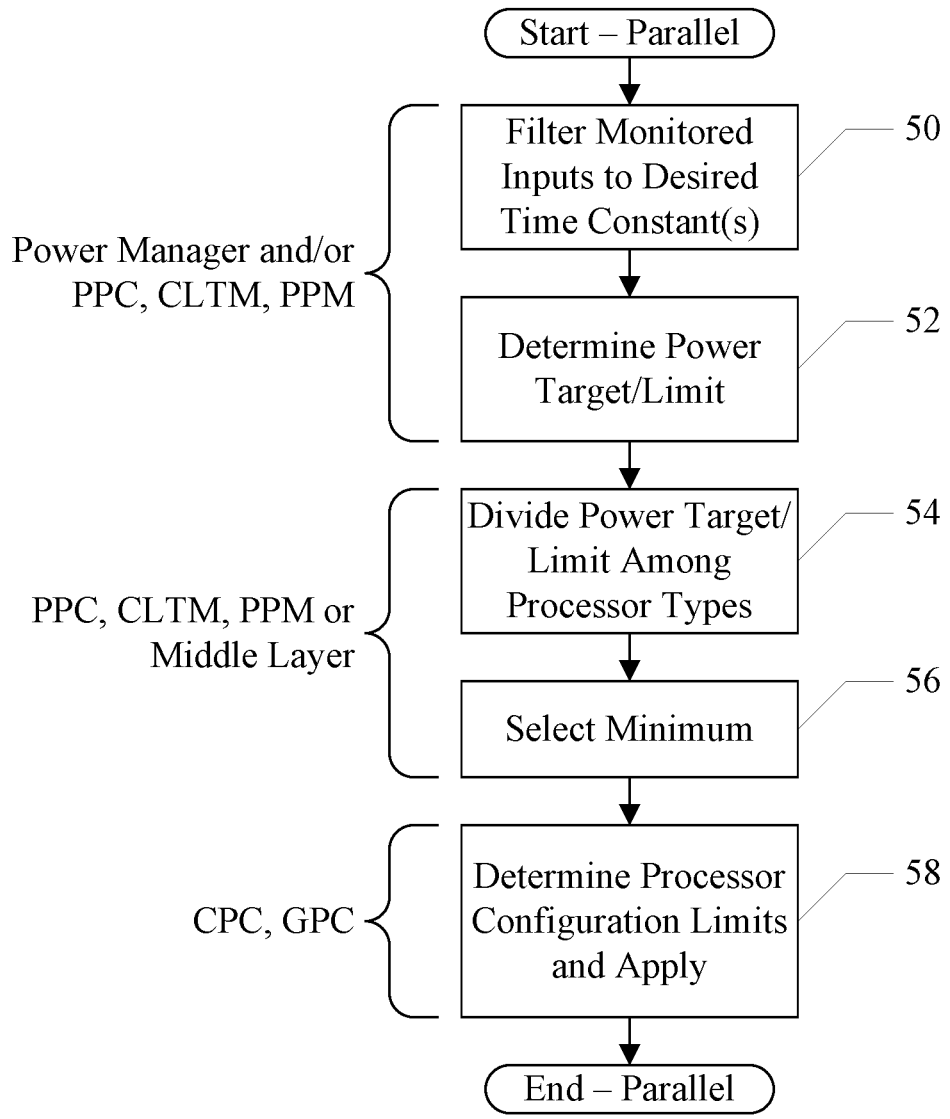
FIG. 2 is a flowchart illustrating operation of one embodiment of the system shown in FIG. 1.

FIG. 2 is a flowchart illustrating operation of one embodiment of system 10 with the PPM 32, the CLTM 30, and the package power controller 28 operating in parallel (e.g. in the manner shown in FIG. 1, for an embodiment). While the blocks are shown in a particular order for ease of illustration, other orders may be used.

The various inputs monitored to estimate the power consumption may be filtered to desired time constants for the PPM 32 and the package power controller 28 (block 50). The filtering may be performed by the power manager 20, the PPM 32, and/or the package power controller 28, as desired. The PPM 32 and the package power controller 28 may determine their respective power targets, or power limits (block 52). The power target may be divided among the processor types (e.g. the CPU 12 and the GPU 14 in the embodiment of FIG. 1) (block 54). The division may be performed by the PPM 32 and the package power controller 28 in parallel, or may be performed by a middle layer (e.g. a power splitter) between the PPM 32 and the package power controller 28 (on one side) and the CPC 22 and GPC 24 (on the other side). The minimum of the power targets and the power target from the CLTM 30 may be selected for each processor type (block 56), and may be provided to the CPC and the GPC. The CPC and the GPC may convert the targets to processor configuration limits (e.g. power states, number of active processors, etc.) (block 58).

FIG. 3 is another embodiment of the system 10. In the embodiment of FIG. 3, the package power controller 28 is inserted in-line between the CLTM 30 and PPM 32 (on one side) and the CPC 22 and GPC 24 on the other side. In this configuration, the CLTM 30 and PPM 32 may only track and determine power targets for the package as a whole. The package power controller 28 may determine a package level power target responsive to inputs from the power manager 20, as well as from the CLTM 30 and the PPM 32. For example, the package power controller 28 may select the lowest power target from the internally-generated power target, the power target from the CLTM 30, and the power target from the PPM 32. The package power controller 28 may divide the available power between the CPU 12, the GPU 14, and any other processors of various types and provide the resulting targets to the CPC 22 and the GPC 24. The division may be based on the relative workload of the different processor types, for example.

Figure 4:
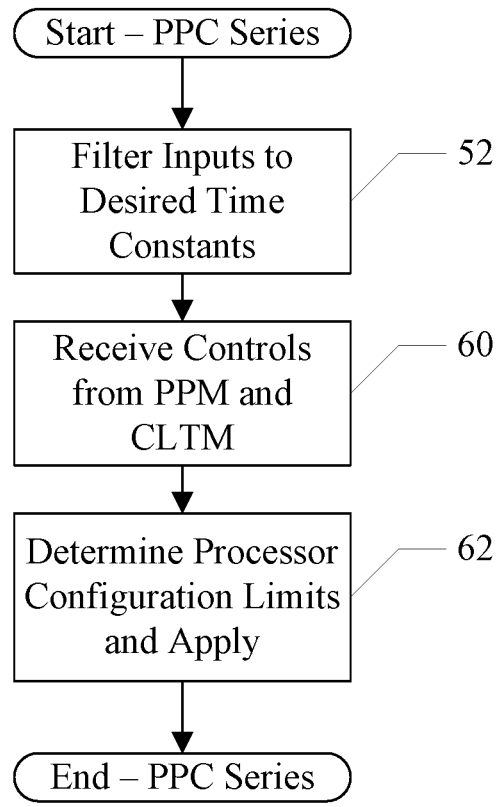
FIG. 4 is a flowchart illustrating operation of one embodiment of the system shown in FIG. 3.

FIG. 4 is a flowchart illustrating operation of one embodiment of system 10 with the package power controller 28 operating in series with the PPM 32 and the CLTM 30 (e.g. in the manner shown in FIG. 3, for an embodiment). While the blocks are shown in a particular order for ease of illustration, other orders may be used.

Similar to the discussion above with regard to FIG. 2, the inputs to the PPM 32 and the package power controller 28 may be filtered to the desired time constants, either in the power manager 20 or in the package power controller 28, and the PPM 32 (block 52). The PPM 32 and CLTM 30 may determine their power target controls and may transmit them to the package power controller 28 (block 60). Based on its internal package power target and the controls from the PPM 32 and the CLTM 30, the package power controller 28 may determine the processor configuration limits for each type (e.g. based on the division of power target between the processors of the various types) and may apply the configuration limits (block 62). As previously mentioned, the configuration limits may include power states, maximum active processors, etc. in various embodiments.

Figure 5:
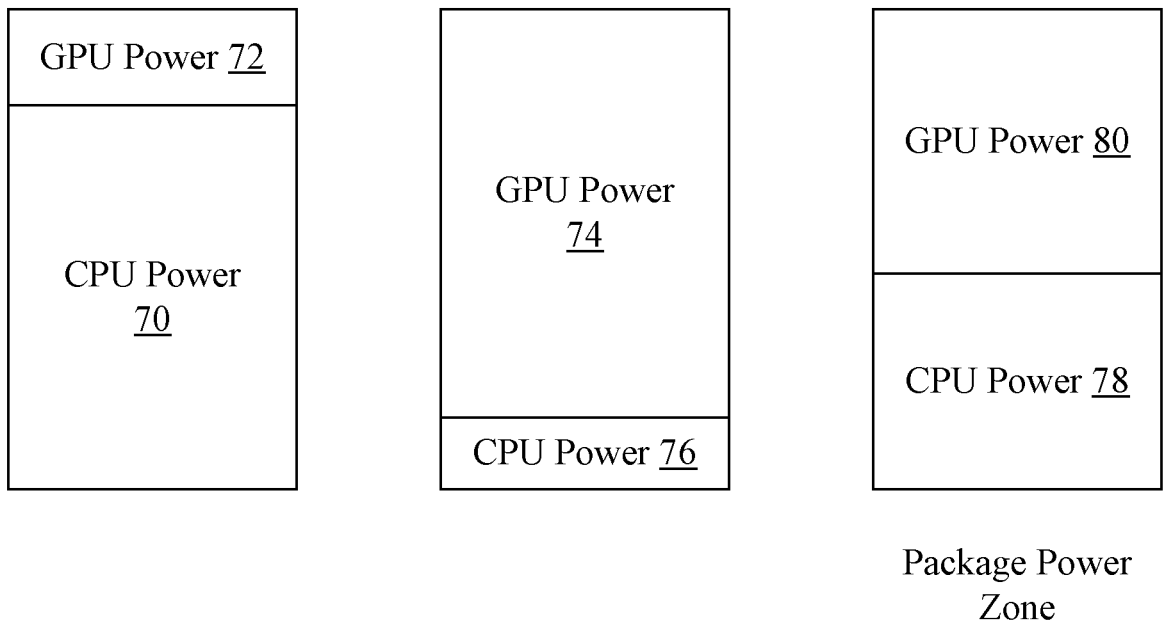
FIG. 5 is a block diagram illustrating various power zone examples.

FIG. 5 is a block diagram illustrating the same amount of power consumption, but different divisions of that power consumption among the processor types (e.g. CPU and GPU in this case). On the left, the total power is dominated by the CPU power (reference numeral 70), and the GPU power may be relatively small (reference numeral 72). The CPU power estimator 38 may detect this scenario and control the total power consumption in this case (e.g. using CPU throttling techniques). In the middle, the total power is dominated by the GPU power (reference numeral 74), and the CPU power is relatively small (reference numeral 74). In this case, the GPU power estimator 40 may detect the scenario and control the total power consumption. On the left, the CPU power (reference numeral 78) and the GPU power (reference numeral 80) are both relatively low, and thus the power estimators 38 and 40 may both detect reasonable power consumption. However, the package power zone detected by the package power controller 28 may reveal the total power consumption is high and may result in power consumption control.

Figure 6:
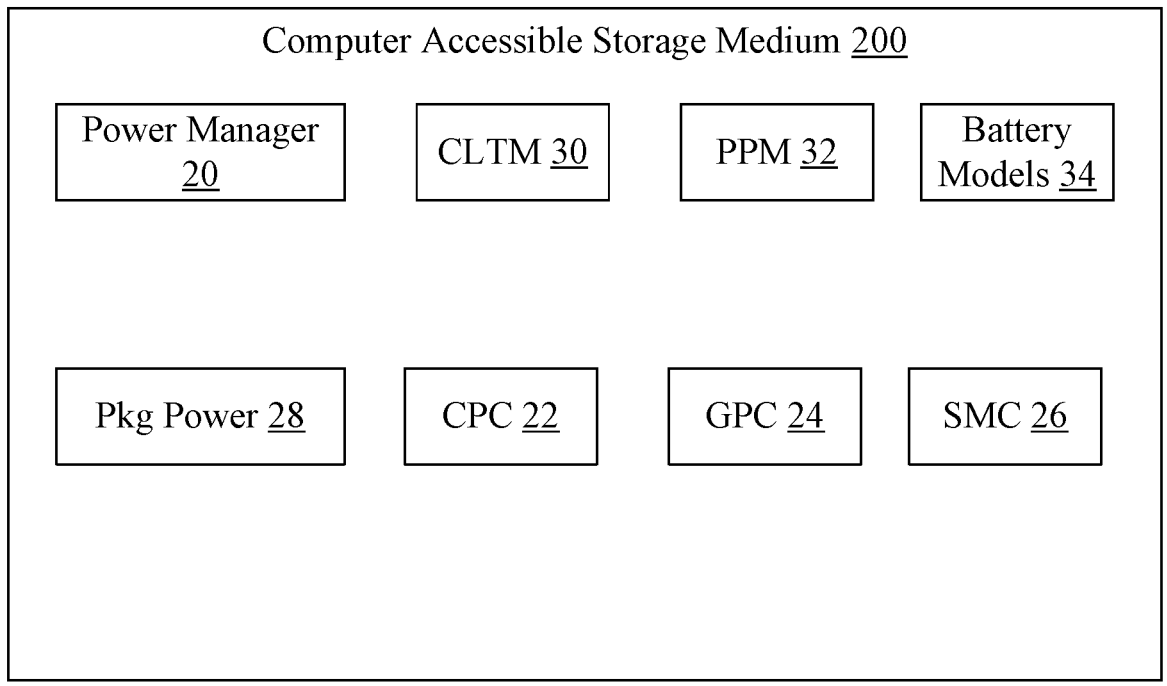
FIG. 6 is a block diagram of one embodiment of a computer accessible storage medium.

FIG. 6 is a block diagram of one embodiment of a computer accessible storage medium 200. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 200 may store data in a non-transitory manner, where non-transitory in this context may refer to not transmitting the instructions/data on a signal. For example, non-transitory storage may be volatile (and may lose the stored instructions/data in response to a power down) or non-volatile.

The computer accessible storage medium 200 in FIG. 9 may store code forming one or more of the power manager 20, the CLTM 30, the PPM 32, the battery models 34, the package power controller 28, the CPC 22, the GPC 24, and/or the SMC 26. Various combinations of the above may be included dependent, e.g., on which of the above are implemented in software. The power manager 20, the CLTM 30, the PPM 32, the battery models 34, the package power controller 28, the CPC 22, the GPC 24, and/or the SMC 26 may comprise instructions which, when executed, implement the operation described above for these components.

Numerous variations and modifications will become apparent to those skilled in the art once the above disclosure is fully appreciated. It is intended that the following claims be interpreted to embrace all such variations and modifications.

What is claimed is:

1. A non-transitory computer accessible storage medium storing a plurality of instructions which, when executed on a system including a plurality of components that are integrated onto an integrated circuit, cause the system to:
   detect that an observable power consumption in a package associated with the integrated circuit has exceeded a first power consumption target, wherein the observable power consumption includes power consumed by a plurality of the plurality of components, and the observable power consumption exceeding the first power consumption target is possible even if each component of the plurality of components is consuming power at less than a respective second power consumption target that triggers mitigation of power consumption for that component when that component exceeds the respective second power consumption target; and
   apply at least one mitigation technique in at least a first component of the plurality of components responsive to detecting that the observable power consumption has exceeded the first power consumption target, even though the first component has a power consumption less than the respective second power consumption target that would trigger mitigation for the first component.

2. The non-transitory computer accessible storage medium as recited in claim 1 wherein the plurality of instructions, when executed:
   detect that the observable power consumption is less than the first power consumption target subsequent to applying the at least one mitigation technique; and
   cease application of the at least one mitigation technique responsive to detecting that the observable power consumption is less than the first power consumption target.

3. The non-transitory computer accessible storage medium as recited in claim 1 wherein the at least one mitigation technique comprises a reduced power state.

4. The non-transitory computer accessible storage medium as recited in claim 1 wherein at least the first component comprises a processor and the at least one mitigation technique includes an instruction issue rate.

5. The non-transitory computer accessible storage medium as recited in claim 1 wherein the plurality of instructions, when executed, cause the system to determine the first power consumption target responsive to estimates of the observable power consumption over a preceding time period.

6. The non-transitory computer accessible storage medium as recited in claim 5 wherein the plurality of instructions, when executed by the system, filter the estimates based on one or more time constants.

7. The non-transitory computer accessible storage medium as recited in claim 5 wherein a plurality of power controllers execute in parallel and determine a plurality of potential power consumption targets to be the first power consumption target, and wherein the plurality of instructions, when executed by the system, select a minimum one of the plurality of potential power consumption targets as the first power consumption target.

8. A system comprising:
   a plurality of components integrated into one or more integrated circuits that are packaged in a package;
   a power manager that monitors an observable power consumption in the package, during use, wherein the observable power consumption includes power consumed by a plurality of the plurality of components;
   a peak power controller that detects, during use, that a first component of the plurality of components is consuming power that exceeds a first power consumption target assigned to the first component, and the peak power controller triggers one or more first mitigation operations on the first component to reduce the power consumption of the first component in response to detecting that first component is consuming power that exceeds the first power consumption target, wherein the first component is one of a first subset of one or more components within the plurality of components for which first power consumption targets are assigned; and
   a package power controller that detects, during use, that the observable power consumption exceeds a second power consumption target for the package, wherein the observable power consumption exceeding the second power consumption target is possible even if power consumed in the components of the first subset are less than the first power consumption targets assigned to the components of the first subset, wherein the package power controller triggers one or more second mitigation operations to reduce power consumption in one or more second components of the plurality of components responsive to the observable power consumption exceeding the second power consumption target.

9. The system as recited in claim 8 wherein a given second component of the one or more second components is assigned the first power consumption target managed by the peak power controller, and wherein the one or more second mitigation operations are triggered even in the event that the given second component is consuming power at less than the first power consumption target.

10. The system as recited in claim 9 wherein the peak power controller further includes a third power consumption target that triggers the one or more second mitigation operations to prevent incorrect functional operation in the system, and wherein the package power controller is configured to override a fourth power consumption target with the third power consumption target responsive to the peak power controller transmitting the third power consumption target.

11. The system as recited in claim 8 further comprising a plurality of power estimators associated with respective components from which the power manager determines the observable power consumption, wherein the plurality of power estimators provide power consumption estimates from which the power manager determines the observable power consumption.

12. The system as recited in claim 8 wherein at least one of the power manager, the peak power controller, or the package power controller comprises a non-transitory computer accessible storage medium storing a plurality of instructions which, when executed on one or more processors in the system, implement the operation of the at least one of the power manager, the peak power controller, or the package power controller.

13. The system as recited in claim 8 wherein at least one of the power manager, the peak power controller, or the package power controller comprises circuitry implemented on the one or more integrated circuits.

14. The system as recited in claim 8 wherein:
   the power manager detects, during use, that the observable power consumption is less than the first power consumption target subsequent to applying the one or more second mitigation operations; and the package power controller ceases application of the one or more second mitigation operations responsive to detecting that the observable power consumption is less than the first power consumption target.

15. The system as recited in claim 8 wherein the power manager determines the first power consumption target responsive to estimates of the observable power consumption over a preceding time period.

16. The system as recited in claim 15 wherein the power manager filters the estimates based on one or more time constants, during use.

17. The system as recited in claim 8 further comprising one or more temperature sensors and a thermal management controller coupled to the one or more temperature sensors, wherein thermal management controller invokes one or more of the first mitigation operations or one or more second mitigation operations responsive to detecting that a temperature detected by the one or more temperature sensors exceeds a temperature target.

18. A system comprising:
- a plurality of components, wherein one or more of the plurality of components implement one or more mitigation operations that are invoked to control power consumption in the one or more of the plurality of components;
- a first power controller configured to invoke a first mitigation operation on a first component of the one or more of the plurality of components responsive to the power consumption of the first component exceeding a first power consumption target assigned to the first component; and
- a second power controller configured to invoke the first mitigation operation of the first component responsive to an observable power consumption in the plurality of components exceeding a second power consumption target, wherein the second power controller invoking the first mitigation operation is performed based on the observable power consumption exceeding the second power consumption target even in the event that the plurality of components are consuming power at less than respective first power targets assigned to respective components of the plurality of components.

19. The system as recited in claim 18 wherein the second power controller is in series with the first power controller.

* * * * *